US005808495A

United States Patent [19]

Tanigaki et al.

[11] Patent Number: 5,808,495

[45] Date of Patent: Sep. 15, 1998

[54] MAGNETRON DRIVING CIRCUIT

[75] Inventors: Hidetoshi Tanigaki, Hyogo; Takashi Yoshihara, Osaka; Yoshihiro Ishii, Hyogo, all of Japan

[73] Assignee: Furuno Electric Company, Limited, Nishinomiya, Japan

[21] Appl. No.: 363,582

[22] Filed: Dec. 23, 1994

Related U.S. Application Data

[63] Continuation of Ser. No. 768,556, Nov. 26, 1991, abandoned.

[51] Int. Cl.[6] .................... H03B 9/10

[52] U.S. Cl. .................... 327/181; 327/304

[58] Field of Search .................... 328/65, 253, 67; 307/282, 571; 327/181, 182, 183, 300, 304; 331/87, 90

[56] References Cited

U.S. PATENT DOCUMENTS

| | | | |
|---|---|---|---|
| 2,590,836 | 4/1952 | Andrew | 328/65 |
| 2,659,019 | 11/1953 | Clayton | 328/65 |
| 2,830,178 | 4/1958 | White | 328/67 |
| 2,946,958 | 6/1960 | Bonia et al. | 328/65 |
| 2,955,263 | 10/1960 | Hobrough | 328/65 |
| 3,015,778 | 1/1962 | Bruijning | 328/67 |
| 3,135,876 | 6/1964 | Embree et al. | 328/67 |
| 3,328,703 | 6/1967 | Lee | 328/65 |
| 3,571,627 | 3/1971 | Cardon | 328/167 |
| 4,002,927 | 1/1977 | Nakamura et al. | 307/246 |
| 4,023,004 | 5/1977 | Burke . | |
| 4,051,439 | 9/1977 | Nyswander | 328/67 |
| 4,489,288 | 12/1984 | French | 328/67 |
| 4,749,877 | 6/1988 | Asazawa et al. | 307/296.1 |
| 4,949,030 | 8/1990 | Tse | 307/571 |

FOREIGN PATENT DOCUMENTS

| | | |
|---|---|---|
| 59-121945 | 8/1984 | Japan . |
| 63-178482 | 7/1988 | Japan . |

OTHER PUBLICATIONS

Sedra et al. "*MIcroelectronic Circuits*", Saunders College Publishing, pp. 308–309, 337–340,349–352, 1991.

Third Edition, "Electronic Circuits Discrete and Integrated" by Donald Schilling 1989 pp. 100–115, 184–205.

Anflo, K.S., et al., "Using A MOS–FET Pulse Amplifier in a Magnetron Transmitter", *International Conference on microwave tubes in systems / problems and prospects*, Institute of Electrical Engineers, London, Oct. 1984, p. 10 et seq.

Ichikawa, Iwao, "How to use FET", *FET* (*VCR*), Feb. 1, 1978, pp. 69–77.

Shironosov, V.G., et al., "Simple Pulse Modulator", *Instruments and Experimental Techniques,* Consultants Bureau, New York, INETAK 31(2), Sep. 1988, pp. 490–491.

"Magnetron Preamble", *Magnetrons,* English Electric Valve Company Limited, Chelmsford, Essex, England, Mar. 1970, pp. 2–9.

*Handbook for Electronics and Communication Engineers,* 1979, pp. 1630–1631, No Month.

Japanese language document, § 7.2 through 7.4, pp. 274–275, No Date.

(List continued on next page.)

*Primary Examiner*—Timothy P. Callahan
*Assistant Examiner*—T. T. Lam
*Attorney, Agent, or Firm*—Reid & Priest LLP

[57] ABSTRACT

According to the present invention, to drive a magnetron, a pulse voltage is applied to the gate electrode of a field effect transistor to make the field effect transistor conductive, so that a voltage stored in a storage condenser is discharged through the primary winding of a pulse transformer and the drain electrode-the source electrode of the field effect transistor. This discharge causes the voltage generated at the primary winding of the pulse transformer to be induced at the secondary winding of the pulse transformer. Thus, the magnetron connected to the secondary winding of the pulse transformer is driven.

5 Claims, 3 Drawing Sheets

OTHER PUBLICATIONS

Skolnik, Merrill I., Naval Research Laboratory, editor, *Radar Handbook,* McGraw–Hill Book Company, 1970, pp. 7–78 through 7–81, No Month.

Japanese language document , pp. 29–26 through 29–31, No Date.

Japanese language document, pp. 19–6 through 19–7 (pp. 1480–1481), No Date.

"Model R10 Raster Scan Radar System", Instruction Manual, Raytheon, circa 1989, pp. 6–8 through 6–10 and Fig. 102, No Month.

MAGNETRON DRIVING CIRCUIT

This is a continuation of U.S. patent application Ser. No. 07/768,556, filed Nov. 26, 1991 now abandoned.

FIELD OF THE INVENTION

The present invention relates to a magnetron driving circuit for driving a magnetron by outputting a driving output from the secondary winding of a pulse transformer.

BACKGROUND ART

FIG. 1 shows a conventional driving circuit for driving a magnetron such as a pulse magnetron.

The conventional driving circuit of FIG. 1 will be explained. After a DC high voltage applied to an input terminal HV is inverted to an AC high voltage by a booster circuit SC, the AC high voltage is applied to a charge storage circuit PC comprising a coil L1 and a condenser C1 through a diode D1 and stored in the charge storage circuit PC.

In response to the timing of conducting a thyristor D2 by applying a trigger pulse to the gate electrode of the thyristor D2, the high voltage stored in the charge storage circuit PC is discharged in a closed loop comprising the charge storage circuit PC, the anode-the cathode of the thyristor D2, and the primary winding L10 of the pulse transformer PT.

The discharge of the high voltage stored causes the primary winding L10 of the pulse transformer PT to receive a voltage of the stored high voltage divided according to the impedance of the charge stored circuit PC and the impedance of the primary winding L10 of the booster pulse transformer PT. The divided voltage to the primary winding L10 of the primary winding L10 is induced to the secondary windings L20 and L30 of the pulse transformer PT, which are in bifilar winding.

A heater power source E is applied to the heater electrode of the pulse magnetron MT through each of the secondary windings L20, L30, and coils L2 and L3, so that the heater electrode is heated. Therefore, the pulse magnetron MT is oscillated at the high frequency by applying, as a driving source, the induced voltage of the secondary winding L30 to the closed circuit loop comprising the secondary winding L30, a resistor R1 connected across an end of the secondary winding L30 and the ground thereof, and the anode a and the cathode K of the pulse magnetron MT.

In the conventional driving circuit for the pulse magnetron, at the line of l—l, the impedance of the driving circuit measured from the pulse magnetron MT as a load to the side of the driving circuit (in the direction of a in FIG. 1) is represented as Z1 while the impedance of the load measured from the side of the driving circuit to the pulse magnetron MT (in the direction of b in FIG. 1) is represented as Z2. Further, the voltage between the cathode K and the ground of the pulse magnetron MT is denoted as V in the vertical axis in FIG. 2 while the anode current of the pulse magnetron MT is denoted as I in the horizontal axis in FIG. 2. Referring to FIG. 2, the impedance of the driving circuit Z1 is plotted approximately linear, but slants to the right, downward. The impedance of the load Z2 crosses the impedance of the driving circuit Z1 with the inclination at a point P as shown in FIG. 2. This point P is an operating point for the pulse magnetron MT.

However, since the property of the pulse magnetron MT may be changed for a long time, the impedance of the load Z2 is changed between Z2' and Z2" as shown, so that the operating point P is also changed to P' or P".

Because the inclination of the impedance of the driving circuit Z1 is approximately linear but slants to the right, downward, the changing width of the operation point, ΔP, is large, accordingly. As a result, the anode current of the pulse magnetron MT is changed greatly. However, the output of the pulse magnetron MT is changed in approximate proportion to the change of the anode current. The great change of the anode current means the great change of the output of the pulse magnetron MT. Therefore, the output characteristics of the pulse magnetron MT are extremely unstable, disadvantageously.

The condenser C1 in the charge storage circuit PC needs to have a large resistive voltage. Any large resistive condenser is large and expensive. In case the pulse magnetron MT is applied to a radar, the output period of the pulse magnetron MT is charged in order to switch the radar for detecting a short-distance object or a long-distance object. Such a control is done by adding circuits similar to the charge storage circuit PC in parallel and switching them one after another. However, a plurality of charge storage circuits PC provided to correspond to the number of switchings makes not only the size large, but also the manufacturing cost becomes expensive, disadvantageously. Basically, the switching control becomes complex.

SUMMARY OF THE INVENTION

According to the present invention, there are provided a storage condenser for storing a high voltage, a field effect transistor for receiving a pulse voltage to its gate electrode, and a pulse transformer the primary winding of which is connected in series across the storage condenser and the field effect transistor, an end of the secondary winding of which is connected to a heater electrode of a magnetron, and the other end of the secondary winding of which is connected to a heater power source of the magnetron. When the impedance of the magnetron such as the pulse magnetron as a load may be charged for a long time, the change of the operating point is minimized to stabilize the output characteristics of the magnetron. Since it is unnecessary to provide any charge storage circuit in the present invention, any large-resistive condenser is not necessary like in the conventional charge storage circuit. Therefore, the driving circuit for the magnetron can be compact and the manufacturing cost can be lowered. In case the magnetron is applied to a radar, the output period of output pulses for detecting a short-distance object or a long-distance object can he controlled easily with a simple circuit construction, which can be manufactured at a low cost.

Preferred Embodiments of the Invention

Figure 1:
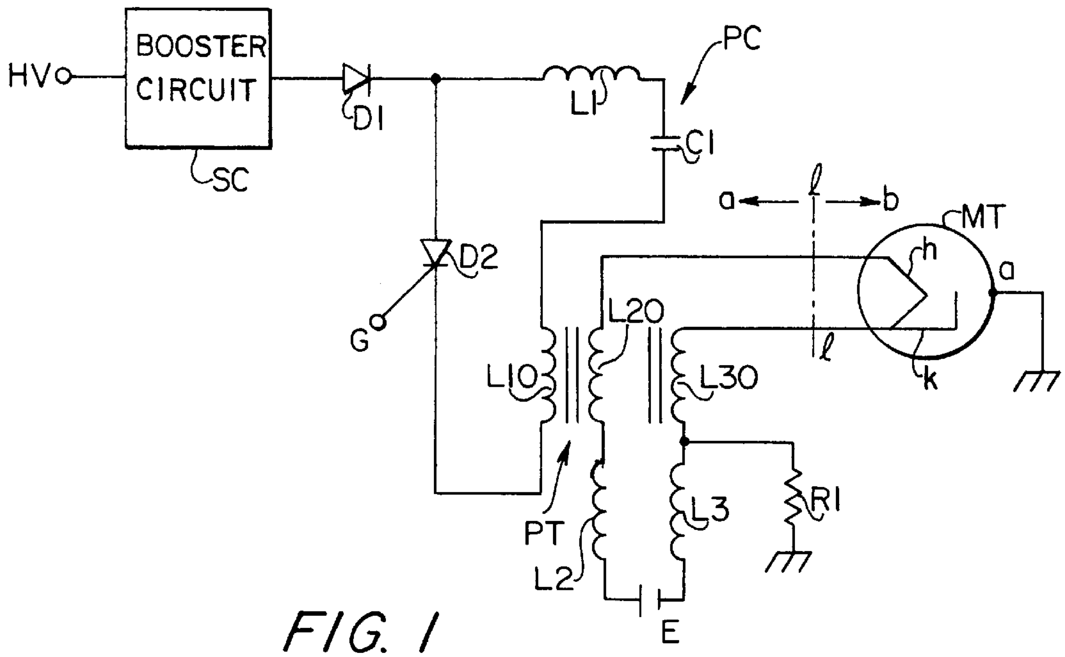
FIG. 1 (PRIOR ART)
FIG. 1 shows a conventional driving circuit for a magnetron.
Figure 2:
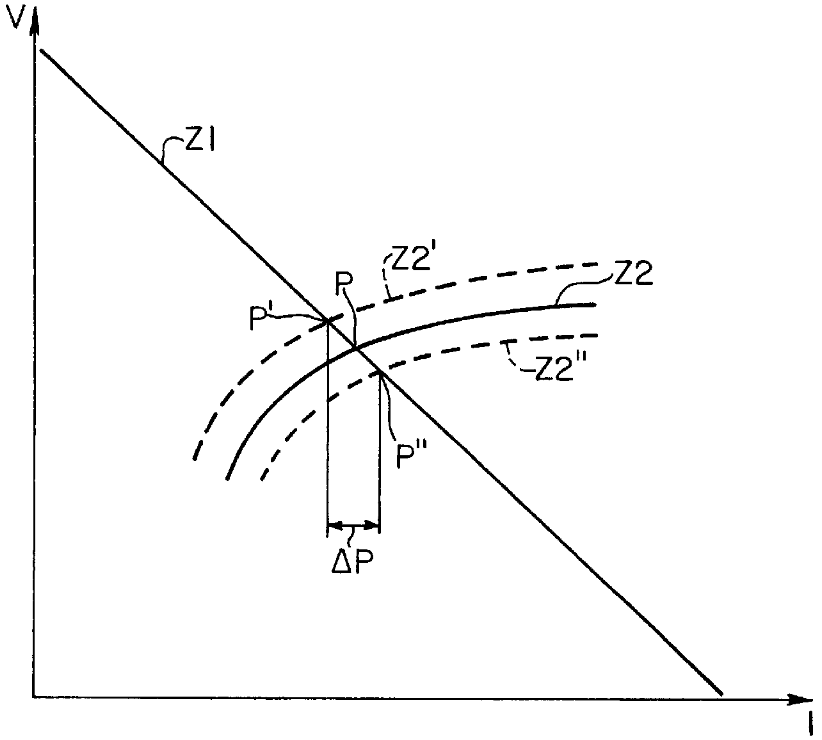
FIG. 2 (PRIOR ART)
FIG. 2 shows a figure for explaining the operation of the conventional driving circuit for the magnetron, showing the current vs. the voltage to magnetron.
Figure 3:
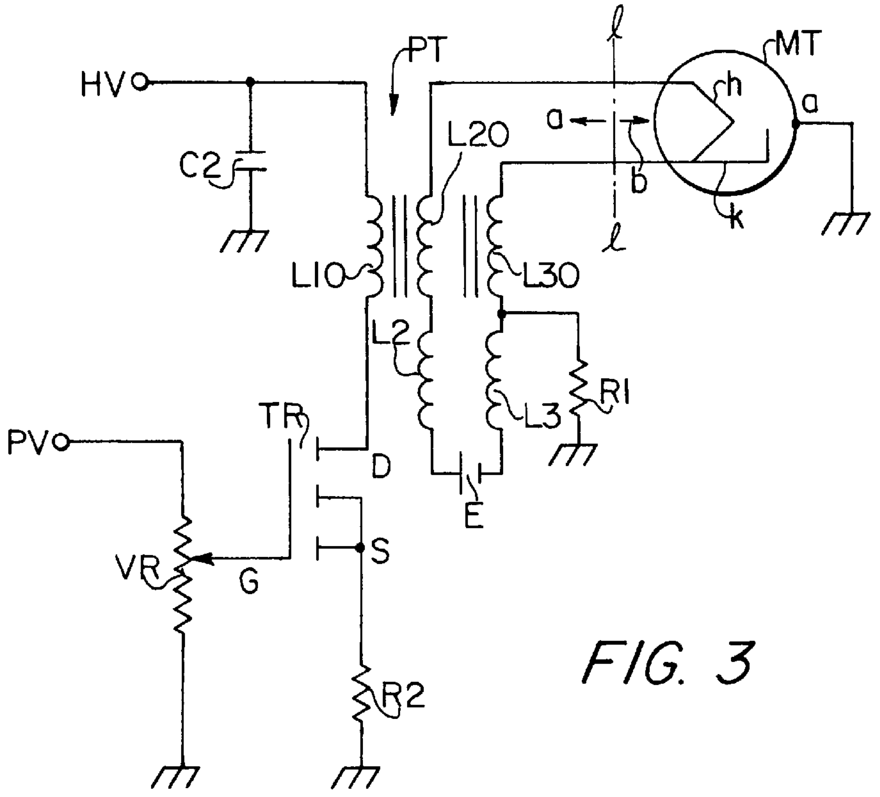
FIG. 3 shows a driving circuit for a magnetron according to a preferred embodiment of the present invention.
Figure 4:
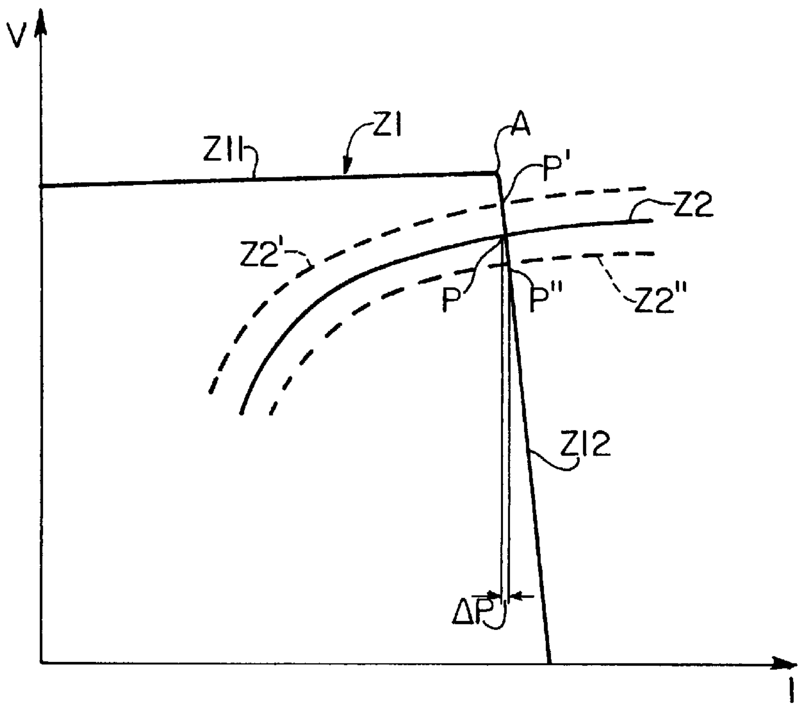
FIG. 4 shows a figure for explaining the operation of the driving circuit for the magnetron according to the preferred embodiment, showing the current vs. the voltage to the magnetron.

The preferred embodiment of the present invention will be described with reference to FIGS. 3 and 4. FIG. 3 shows a circuit of a pulse magnetron, to which the preferred embodiment of the present invention is applied, and a driving circuit for driving the pulse magnetron according to the preferred embodiment. FIG. 4 is a figure for explaining the operation of the preferred embodiment, corresponding to the conventional operation of FIG. 2. Like or corresponding elements in FIGS. 1 and 2 are denoted by like numerals in FIGS. 3 and 4, with the common description related to the like numerals omitted.

Referring to FIG. 3, in the driving circuit according to the preferred embodiment of the present invention, a high voltage entered from an input terminal HV is stored into a storage condenser C2. When a pulse voltage with a certain pulse width is entered from a pulse input terminal PV, the pulse voltage is divided by a variable resistor VR and applied to a gate electrode G of a power MOS type and a N-channel field effect transistor TR. Then, the field effect transistor TR becomes conductive, so that the high voltage stored in the storage condenser C2 is discharged through the primary winding L10 of the pulse transformer PT, the source electrode S and the drain electrode D of the field effect transistor TR, and a current-limiting resistor R2. This discharge induces a voltage in the primary winding L10 and the induced voltage is boosted by the secondary windings L20 and L30 of the pulse transformer PT.

Figure 5:
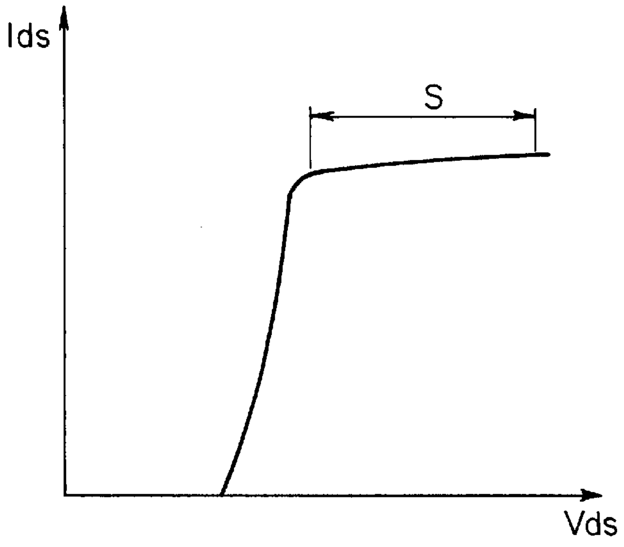
FIG. 5 shows voltage-current characteristics of a field effect transistor used in the driving circuit according to the preferred embodiment of the present invention.

A current Ids flowing across the drain electrode and the source electrode of field effect transistor TR is set within a range of "S" showing an approximately constant current in the characteristic curve of a voltage (Vds)-current (Ids) of the field effect transistor as shown in FIG. 5. The set current Ids depends on a voltage Vgs across the gate electrode and the source electrode of the field effect transistor. The voltage Vgs is defined by the gate electrode G of the field effect transistor TR, the current Ids, and the current-limiting resistor R2. The current-limiting resistor R2 is defined by a forward transmission coefficient of the field effect transistor and the current Ids.

Thereafter, the pulse magnetron MT is oscillated in the same manner as in the conventional case to output an oscillation output.

Thus, in the driving circuit according to the preferred embodiment of the present invention, in terms of the impedance of the driving circuit Z1 viewed to the side of a from the line of l—l and the impedance of the pulse magnetron MT as the load, Z2, the impedance of the driving circuit is represented as shown in FIG. 4, corresponding to the voltage Vds across the drain electrode D and the source electrode S, and the current Ids across the source electrode S and the drain electrode D since the field effect transistor TR is provided at the driving circuit. The impedance of the driving circuit Z1 can be represented by a composition of a part of impedance Z11 which inclination slants to the right a bit and another part of impedance Z12 which inclination is approximately zero. When the impedance of the load Z2 is set to cross the part of the impedance Z12, the change of the operating point P can be remarkably small even if the operating point P of the pulse magnetron MT is varied to P' or P" due to the change in years.

Thus, the change of the operating point is made small so that the change of the anode current is small to stabilize the output characteristics of the pulse magnetron MT.

In the preferred embodiment of the present invention, the charge storage circuit as in the conventional case is not used and any large-resistive condenser in the conventional charge storage circuit is not required, either, so that the size can be compact with the cost down, accordingly.

Figure 6:
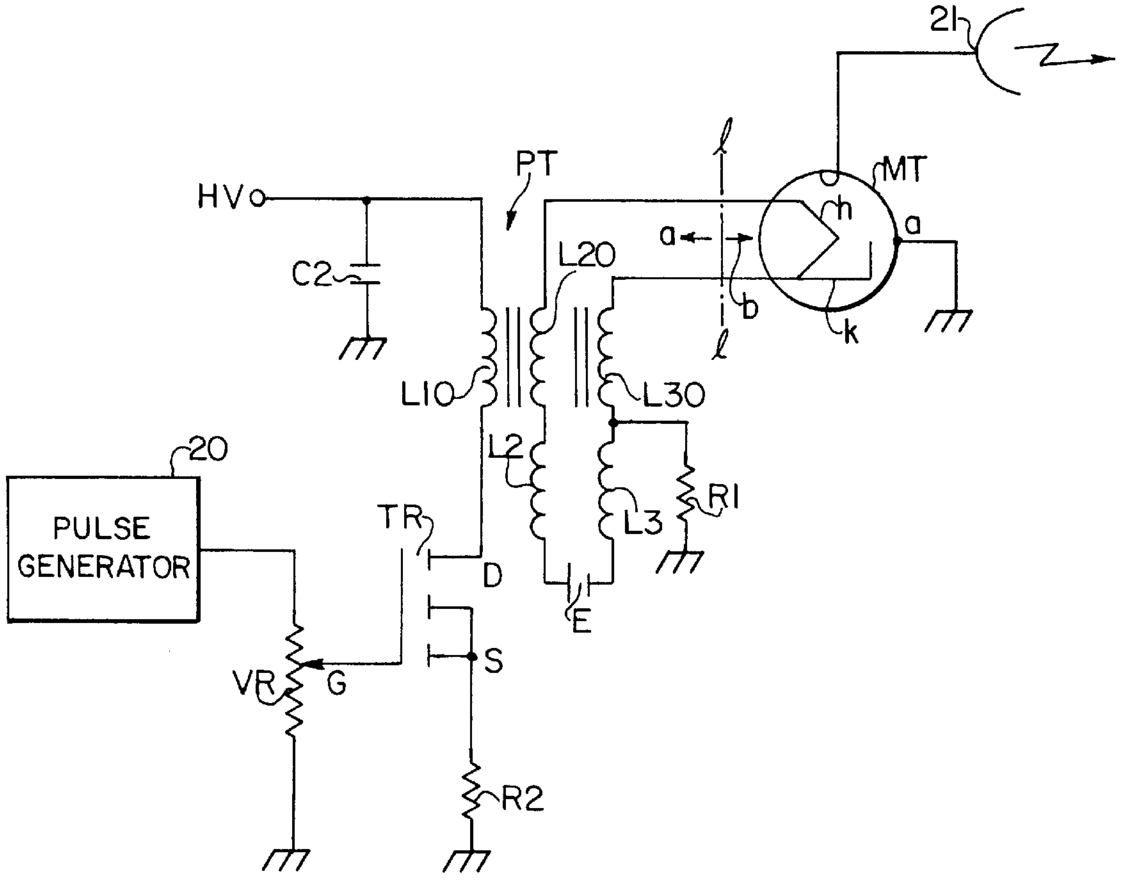
FIG. 6 shows another driving circuit for a magnetron according to another preferred embodiment of the present invention.

Referring to FIG. 6, a pulse generator 20 comprises a mono-stable multivibrator. When the radar should detect a distance up to 3 miles, for example, the pulse width should be 0.1 $\mu$s. When it should detect one up to 6 miles, the pulse width should be 0.3 $\mu$s. The output signals from the pulse magnetron MT are transmitted to an antenna 21. The antenna 21 emits pulse signals of the ultrashort waves to the surrounding. The other construction and operation of FIG. 6 are similar to those of FIG. 3 and any further description omitted here.

Industrial Application

The magnetron driving circuit of the present in invention can be applied to a driving circuit for a magnetron generating ultrashort wave pulses suitable for a radar.

We claim:

1. A radar apparatus, comprising:

a) a storage condenser connected to a power source for storing a high voltage;

b) a field effect transistor (FET) having:

1) a drain electrode;

2) a source electrode coupled to ground; and 3) a gate electrode which is connected to a pulse generator for receiving a pulse voltage;

c) a pulse transformer having:

1) a primary winding connected in series between the storage condenser and the FET's drain electrode; and 2) a secondary winding which is connected to a heater power source;

d) a magnetron having a heater electrode which is connected to the pulse transformer's secondary winding for producing a search pulse signal; and e) a radar antenna coupled to the magnetron for receiving the search pulse signal;

wherein the FET is connected so as to be driven at and around an operating point in a region of a characteristic curve of the drain-to-source voltage Vds and a drain-to-source current Ids in which Ids is maintained substantially constant so that a current of the magnetron is maintained substantially constant irrespective of a voltage of the power source.

2. The apparatus of claim 1, further comprising:

a resistor connected between the FET's source electrode and ground.

3. A radar apparatus, comprising:

a) a storage condenser connected to a power source, for storing a high voltage;

b) a field effect transistor (FET) having:

1) a drain electrode;

2) a source electrode coupled to ground via a resistor; and 3) a gate electrode which is connected to a pulse generator for receiving a pulse voltage;

c) a pulse transformer having:

1) a primary winding connected in series between the storage condenser and the FET's drain electrode; and 2) a secondary winding which is coupled to a heater power source;

d) a magnetron having a heater electrode which is connected to the pulse transformer's secondary winding for producing a search pulse signal; and e) a radar antenna coupled to the magnetron for receiving the search pulse signal;

wherein the FET is connected so as to be driven at and around an operating point in a region of a characteristic curve of the drain-to-source voltage Vds and a drain-to-source current Ids in which Ids is maintained substantially constant so that a current of the magnetron is substantially constant irrespective of characteristics of the magnetron and irrespective of a voltage of the power source.

4. A radar apparatus, comprising:

a) a power source;

b) a storage condenser which is connected to the power source for storing a high voltage;

c) a pulse generator;

d) a magnetron output control means which is connected to an output of the pulse generator;

e) a resistor;

f) a field effect transistor (FET) having:

1) a drain electrode;

2) a source electrode coupled to ground via the resistor; and 3) a gate electrode which is connected to the pulse generator via the magnetron output control means, for receiving a pulse voltage;

g) a pulse transformer having:

1) a primary winding connected in series between the storage condenser and the FET's drain electrode; and 2) a secondary winding which is coupled to a heater power source;

h) a magnetron having a heater electrode which is connected to the pulse transformer's secondary winding for producing a search pulse signal; and h) a radar antenna coupled to the magnetron for receiving the search pulse signal;

wherein the FET is connected so as to be driven at and around an operating point in a region of a characteristic curve of the drain-to-source voltage Vds and a drain-to-source current Ids in which Ids is maintained substantially constant so that a current of the magnetron is substantially constant irrespective of characteristics of the magnetron and irrespective of a voltage of the power source.

5. The apparatus of claim 4, wherein:

the magnetron output control means includes a potentiometer.

* * * * *